US012610559B2

(12) United States Patent
Lee

(10) Patent No.: US 12,610,559 B2
(45) Date of Patent: Apr. 21, 2026

(54) NON-VOLATILE MEMORY DEVICE AND METHOD FOR DRIVING SAME

(71) Applicant: DAEGU GYEONGBUK INSTITUTE OF SCIENCE AND TECHNOLOGY, Daegu (KR)

(72) Inventor: Hyeon Jun Lee, Daegu (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 0 days.

(21) Appl. No.: 18/572,263

(22) PCT Filed: Jan. 4, 2023

(86) PCT No.: PCT/KR2023/000119
§ 371 (c)(1),
(2) Date: Dec. 20, 2023

(87) PCT Pub. No.: WO2023/149670
PCT Pub. Date: Aug. 10, 2023

(65) Prior Publication Data
US 2024/0389361 A1 Nov. 21, 2024

(30) Foreign Application Priority Data

Feb. 7, 2022 (KR) ........................ 10-2022-0015751

(51) Int. Cl.
*G11C 11/00* (2006.01)
*G11C 11/56* (2006.01)
(Continued)
(52) U.S. Cl.
CPC .............. *H10B 63/82* (2023.02); *G11C 11/56* (2013.01); *G11C 13/004* (2013.01);
(Continued)

(58) Field of Classification Search
CPC ...... H10B 63/82; H10N 70/25; H10N 70/253; H10N 70/011; G11C 11/56; G11C 13/004; G11C 13/0069; G11C 2213/53
(Continued)

(56) References Cited

U.S. PATENT DOCUMENTS

| | | | |
|---|---|---|---|
| 7,786,526 B2 * | 8/2010 | Takano | .................. H10B 41/40 257/311 |
| 8,729,620 B2 * | 5/2014 | Yamazaki | .............. H10D 86/40 257/314 |

(Continued)

FOREIGN PATENT DOCUMENTS

| | | | | |
|---|---|---|---|---|
| EP | 1837900 A2 * | 9/2007 | ........... | H10D 86/201 |
| JP | H07193151 | 7/1995 | | |

(Continued)

OTHER PUBLICATIONS

Wu Hua-Qiang et al, "Asymmetric resistive switching processes in W:AIO x/WO y bilayer devices", May 2015, IAEA journal https://inis.iaea.org/records/qn6m4-40253 (Year: 2015).*

(Continued)

*Primary Examiner* — Viet Q Nguyen
(74) *Attorney, Agent, or Firm* — LEX IP MEISTER, PLLC

(57) ABSTRACT

A non-volatile memory device according to various embodiments of the present invention is characterized in that the non-volatile memory device includes a substrate, a first electrode disposed on the substrate, an insulating layer contacting the first electrode, a semiconductor layer contacting the insulating layer, and a second electrode contacting the semiconductor layer, and is driven using an asymmetrical local energy state (ALES) induced in the semiconductor layer under the condition that at least a portion of the first electrode contacts the semiconductor layer.

(Continued)

A method of driving the non-volatile memory device in accordance with various embodiments of the present invention includes inducing an asymmetrical local energy state (ALES) generated due to instantaneous acceleration of electrons injected into the semiconductor layer, and removing the ALES from the semiconductor layer, for recovery of the semiconductor layer.

15 Claims, 19 Drawing Sheets

(51) Int. Cl.
| | |
|---|---|
| *G11C 13/00* | (2006.01) |
| *H10B 63/00* | (2023.01) |
| *H10N 70/00* | (2023.01) |
| *H10N 70/20* | (2023.01) |

(52) U.S. Cl.
CPC ....... *G11C 13/0069* (2013.01); *H10N 70/011* (2023.02); *H10N 70/25* (2023.02); *H10N 70/253* (2023.02); *G11C 2213/53* (2013.01)

(58) Field of Classification Search
USPC ........................................................ 365/148
See application file for complete search history.

(56) References Cited

U.S. PATENT DOCUMENTS

2006/0067122 A1* 3/2006 Verhoeven ......... G11C 16/0466
365/185.05

2007/0076482 A1* 4/2007 Kato ..................... H10D 86/01
257/E29.302

FOREIGN PATENT DOCUMENTS

| | | | | |
|---|---|---|---|---|
| JP | 2005-150765 | 6/2005 | | |
| KR | 10-2010-0020804 | 2/2010 | | |
| KR | 20130073247 | 7/2013 | | |
| KR | 20170000331 | 1/2017 | | |
| KR | 101834507 | 4/2018 | | |
| KR | 20180050089 | 5/2018 | | |
| KR | 101974777 | 9/2019 | | |
| KR | 20230119514 A * | 8/2023 | ........... | G11C 13/004 |
| WO | WO-2023149670 A1 * | 8/2023 | ........... | G11C 13/004 |

OTHER PUBLICATIONS

Ah Rahm Lee et al, "Multi-level resistive switching observations in asymmetric Pt/Ta2O5—x/TiOxNy/TIN/Ta2O5-x/Pt multilayer configurations", Aug. 2013, AIP Publishing, vol. 103, issues 6. https://pubs.aip.org/aip/apl/article/103/6/063505/236731/Multi-level-resistive-switching-observations-in (Year: 2013).*

Miyatani T, Nishi Y, Kimoto T. Two modes of bipolar resistive switching characteristics in asymmetric TaOx-based ReRAM cells. MRS Advances. 2019;4(48):2601-2607. doi: 10.1557/adv.2019.316 (Year: 2019).*

Agnes Gubicza et al, "Asymmetry-induced resistive switching in Ag—Ag2S—Ag memristors enabling a simplified atomic-scale memory design", 2016, Scientific Reports, article # 20775 (Year: 2016).*

* cited by examiner

<u>10</u>

14 rt          ft

NON-VOLATILE MEMORY DEVICE AND METHOD FOR DRIVING SAME

TECHNICAL FIELD

Various embodiments of the present invention relate to a non-volatile memory device and a method of driving the same, and more particularly to a non-volatile memory device drivable through a new mechanism and a method of driving the same.

BACKGROUND ART

Modern information communication society requires a semiconductor device having an ability to more rapidly process more information, for exchange of complex content including text, audio, video, etc. through bidirectional communication. However, among current storage devices, a volatile memory has been analyzed to reach the limit of growth. To this end, development of next-generation memory capable of replacing the volatile memory is being actively conducted. Need for development of a non-volatile memory device configured to achieve ultra-high integration required for storage of economical/industrial high-capacity information is increasing more than ever.

Among non-volatile memory devices, a resistive random access memory device (ReRAM) is a non-volatile memory device configured to vary an electrical resistance of a material through application of an external voltage thereto, thereby utilizing a resultant resistance difference for on/off operations. This non-volatile memory device may achieve high integration using a simple structure, as compared to other kinds of non-volatile memories, and, as such, may be one of next-generation non-volatile memory device candidates capable of replacing memory devices in the current memory market in which DRAM and flash memory are dominant.

For conventional resistive random access memory devices, there is a filament system in which a channel for migration of electrons is formed using defects of oxygen atoms, thereby adjusting a level of resistance. However, this system has problems in that resistance producibility is very low, and generation of various levels of resistance is impossible.

In addition, there is a system using a wall motion structure in which an oxide layer is interposed between two electrodes, to control a resistance difference by a thickness of the oxide film. However, this system has problems in that response time is slow, an on/off ratio of a resistor is low, and a material usable for the system is limited to a particular material and, as such, there is a limitation on material selection.

To this end, in association with a toggle type non-volatile memory device using a resistor (R-RAM), a resistance-based non-volatile memory device capable of generating a stable signal is continuously needed. However, conventional resistive memories have various problems and, as such, alternative technology for overcoming the problems is needed.

DISCLOSURE OF INVENTION

Technical Problem

In various embodiments of the present invention, it may be possible to provide a non-volatile memory device drivable through a new mechanism different from those of conventional resistive memories while realizing multi-level characteristics of multiple resistors and a method of driving the same.

Solution to Problem

A non-volatile memory device according to various embodiments of the present invention includes including a substrate, a first electrode disposed on the substrate, an insulating layer contacting the first electrode, a semiconductor layer contacting the insulating layer, and a second electrode contacting the semiconductor layer, wherein the non-volatile memory device is driven using an asymmetrical local energy state (ALES) induced in the semiconductor layer under a condition that at least a portion of the first electrode contacts the semiconductor layer.

A method of driving the non-volatile memory device in accordance with various embodiments of the present invention includes inducing an asymmetrical local energy state (ALES) generated due to instantaneous acceleration of electrons injected into the semiconductor layer, and removing the ALES from the semiconductor layer, for recovery of the semiconductor layer.

Advantageous Effects of Invention

In accordance with the present invention, it may be possible to generate a stable signal in a toggle type non-volatile memory device using a simple 2-terminal structure. In particular, the present invention provides a non-volatile memory capable of being driven through a new mechanism different from those of existing resistive memories and realizing multi-level characteristics of multiple resistors. That is, the present invention may implement a non-volatile memory using an asymmetrical local energy state (ALES) generated in accordance with instantaneous acceleration of electrons injected into a semiconductor layer.

MODE(S) FOR CARRYING OUT THE INVENTION

Hereinafter, various embodiments of the present disclosure will be described with reference to the accompanying drawings. It should be understood that the embodiments and terms used therein are not intended to limit technologies described in the present disclosure to particular embodiments and, as such, various changes, equivalents, and/or substitutions of the embodiments are included in the described technologies.

Hereinafter, various embodiments of the present disclosure will be described with reference to the accompanying drawings.

First, a non-volatile memory device according to an embodiment of the present invention will be described with reference to FIG. 1.

Figure 1:
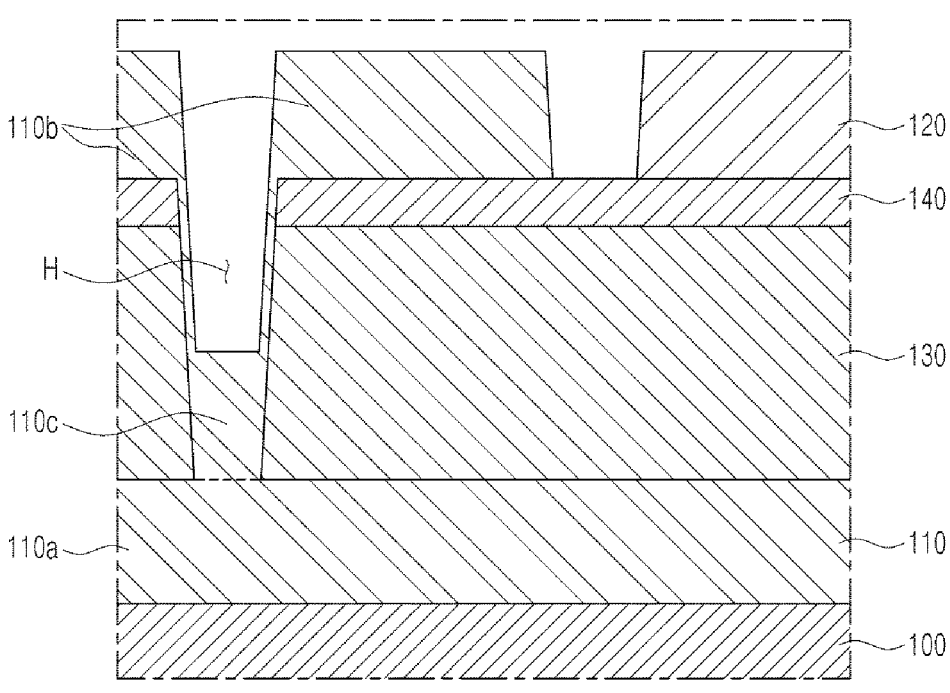
FIG. 1 is a sectional view of a non-volatile memory device according to an embodiment of the present invention.

FIG. 1 is a sectional view of a non-volatile memory device according to an embodiment of the present invention.

Referring to FIG. 1, a non-volatile memory device 10 according to an embodiment of the present invention may include a substrate 100, a first electrode 110, an insulating layer 130, a semiconductor layer 140, and a second electrode 120. The non-volatile memory device 10 according to the embodiment of the present invention is a 2-terminal structure and, as such, may be driven using an asymmetrical local energy state (ALES) induced in the semiconductor layer 140. In addition, the structure of the non-volatile memory device 10 of FIG. 1 may be a horizontal structure in which the first electrode 110, the insulating layer 130, the semiconductor layer 140, and the second electrode 120 are horizontally disposed on the substrate 100.

The substrate 100 may be made of at least one of a silicon (Si) substrate, a germanium (Ge) substrate, a glass substrate, or a PET film on which an insulating layer of, for example, silicon dioxide ($SiO_2$), aluminum oxide ($Al_2O_3$), or hafnium oxide ($HfO_2$), is grown or deposited, without being limited thereto.

The first electrode 110 may be disposed on the substrate 100. The first electrode 110 may be made of a low-resistivity metal material such as one selected from the group consisting of molybdenum (Mo), aluminum (Al), chromium (Cr), gold (Au), palladium (Pd), platinum (Pt), titanium (Ti), nickel (Ni), and copper (Cu) or an alloy thereof, without being limited thereto.

The insulating layer 130 may be disposed on the substrate 100 including the first electrode 110. The insulating layer 130 functions to insulate the first electrode 110, and may be made of silicon oxide ($SiO_x$) or silicon nitride ($SiN_x$) or may be constituted by multiple layers of silicon oxide ($SiO_x$) and silicon nitride ($SiN_x$).

The semiconductor layer 140 may be disposed on the insulating layer 130. The semiconductor layer 140 may include nano-wires, nano-particles, an organic substance, a hybrid material, etc. In detail, as examples of a material usable for the semiconductor layer 140, there may be InGaZnO, ZnO, GaN, Si, SiGe, CdS, $V_2O_5$, NiO, C, GaAs, SiC, ZnS, ZnSe, ZnTe, CdS, CdSe, CdTe, HgSe, HgTe, CuAls, AllnP, AlGaAs, AllnAs, AlGaSb, AllnSb, GalnP, GalnAs, GalnSb, GaPAs, GaAsSb, InPAs, InAsSb, etc.

The first electrode 110 and the second electrode 120 may be disposed on the semiconductor layer 140.

The first electrode 110 and the second electrode 120 may be made of a low-resistivity metal material such as one selected from the group consisting of molybdenum (Mo), aluminum (Al), chromium (Cr), gold (Au), palladium (Pd), platinum (Pt), titanium (Ti), nickel (Ni), and copper (Cu) or an alloy thereof, without being limited thereto.

In the embodiment of the present invention, the first electrode 110 may include a first electrode portion 110a, a second electrode portion 110b, and a third electrode portion 110c. In detail, the first electrode portion 110a is a portion of the first electrode 110 horizontally disposed in parallel to the substrate 100. The second electrode portion 110b is a portion of the first electrode 110 horizontally disposed in parallel to the substrate 100 while contacting the semiconductor layer 140. The third electrode portion 110c is a portion of the first electrode 110 interconnecting the first electrode portion 110a and the second electrode portion 110b.

The insulating layer 130 and the semiconductor layer 140 are horizontally disposed in parallel to the substrate 100, and may include a via hole H extending therethrough. The third electrode portion 110c may be disposed within the via hole H. That is, the third electrode portion 110c may interconnect the first electrode portion 110a and the second electrode portion 110b through the via hole H.

Meanwhile, a protective layer configured to protect the semiconductor layer 140 may be further formed on the first electrode 110 and the second electrode 120.

The non-volatile memory device 10 according to the embodiment of the present invention may induce a variation in resistance state by inducing generation of an asymmetrical local energy state (ALES) in the semiconductor layer 140 or removing an ALES from the semiconductor layer 140. In detail, an ALES may be generated in the semiconductor layer 140 in accordance with application of a voltage in the form of a pulse to the second electrode 120 and connection of the first electrode 110 to ground or application of, to the first electrode 110, a voltage lower than the pulse applied to the second electrode 120. As the first electrode 110 is maintained at a ground voltage or the voltage lower than the pulse, an ALES may be generated under the condition that application of current caused by the pulse to the semiconductor layer 140 is prevented. That is, the ALES may be generated by hot electrons generated as electrons injected from the second electrode 120 into the semiconductor layer 140 are instantaneously accelerated. Hot electrons are accelerated electrons having high energy. When such accelerated electrons are injected into the semiconductor layer 140, a local energy state may be generated due to collision of the accelerated electrons against semiconductor elements. Such a local energy state may be asymmetrically generated only in local regions under the second electrode 120 into which the pulse is injected. That is, the ALES may be generated at an edge portion of the second electrode 120 under the second electrode 120. The ALES generated as described above may cause distortion of an electric field, thereby interrupting flow of electrons. As a result, a high resistance state causing an increase in resistance may be induced.

Meanwhile, it may be possible to remove an ALES generated in the semiconductor layer 140 by applying a positive voltage to the first electrode 110 while connecting a negative voltage to the second electrode 120 or connecting the second electrode 120 to ground. That is, when current flows through the semiconductor layer 140, Joule heating may be induced and, as such, the ALES may be removed. Accordingly, the semiconductor layer 140 may be recovered to an original state thereof. Thus, a low resistance state causing a decrease in resistance may be induced.

Through such state variation, it may be possible to perform a data writing procedure or a data reading procedure.

Hereinafter, a non-volatile memory device according to an embodiment of the present invention will be described with reference to FIG. 2. Meanwhile, no description will be given of the content identical or similar to the content described with reference to FIG. 1.

Figure 2:
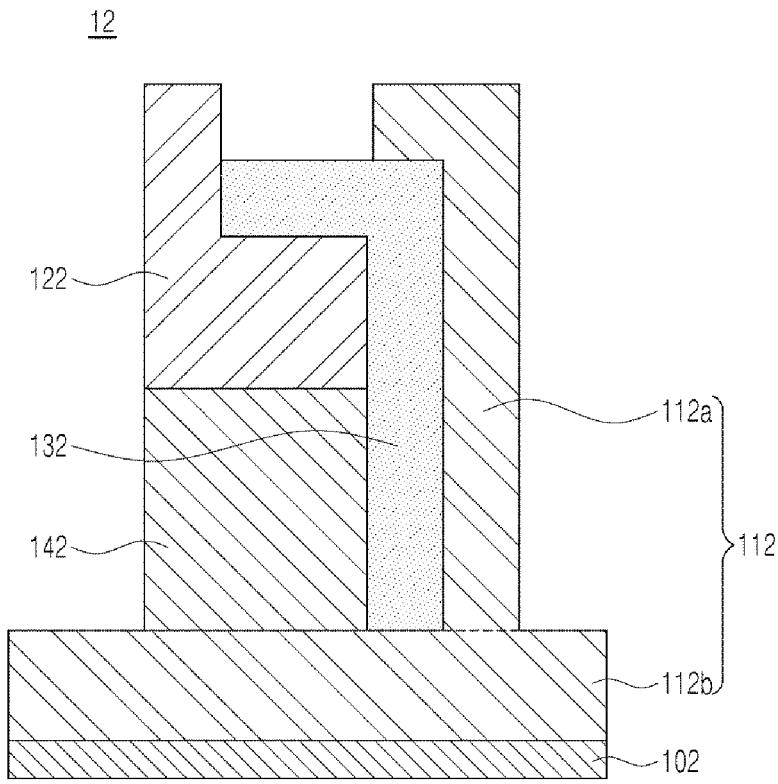
FIG. 2 is a sectional view of a non-volatile memory device according to an embodiment of the present invention.

FIG. 2 is a sectional view of a non-volatile memory device according to an embodiment of the present invention.

Referring to FIG. 2, a non-volatile memory device 12 according to an embodiment of the present invention may include a substrate 102, a first electrode 112, an insulating layer 132, a semiconductor layer 142, and a second electrode 122. The non-volatile memory device 12 according to the embodiment of the present invention is a 2-terminal structure, and may be a vertical structure in which at least a part of the first electrode 112, the insulating layer 132, the semiconductor layer 142, and the second electrode 122 are vertically disposed on the substrate 102. The non-volatile memory device 12 according to the embodiment of the present invention may be driven using an asymmetrical local energy state (ALES) induced in the semiconductor layer 142.

In more detail, the first electrode 112 disposed on the substrate 102 may include a fourth electrode portion 112a and a fifth electrode portion 112b.

The fourth electrode portion 112a is a region including a portion vertically disposed in perpendicular to the substrate 102. The fifth electrode portion 112b is a region horizontally disposed in parallel to the substrate 102 while contacting the semiconductor layer 142. That is, the fifth electrode portion 112b of the first electrode 112 may be disposed on the substrate 102, and the semiconductor layer 142, the insulating layer 132, and the fourth electrode portion 112a may be vertically disposed on the fifth electrode portion 112b.

The second electrode 122 may be disposed to contact the semiconductor layer 142. That is, the second electrode 122 may be disposed on the semiconductor layer 142. Generation of an ALES may be induced in the semiconductor layer 142 in accordance with application of a pulse signal to the second electrode 122 as described above. In addition, the ALES generated in the semiconductor layer 142 may be removed through application of a positive voltage in the form of a DC voltage to the first electrode 112.

Hereinafter, a non-volatile memory device according to an embodiment of the present invention will be described with reference to FIG. 3. Meanwhile, no description will be given of the content identical or similar to the content described with reference to FIG. 1.

Figure 3:
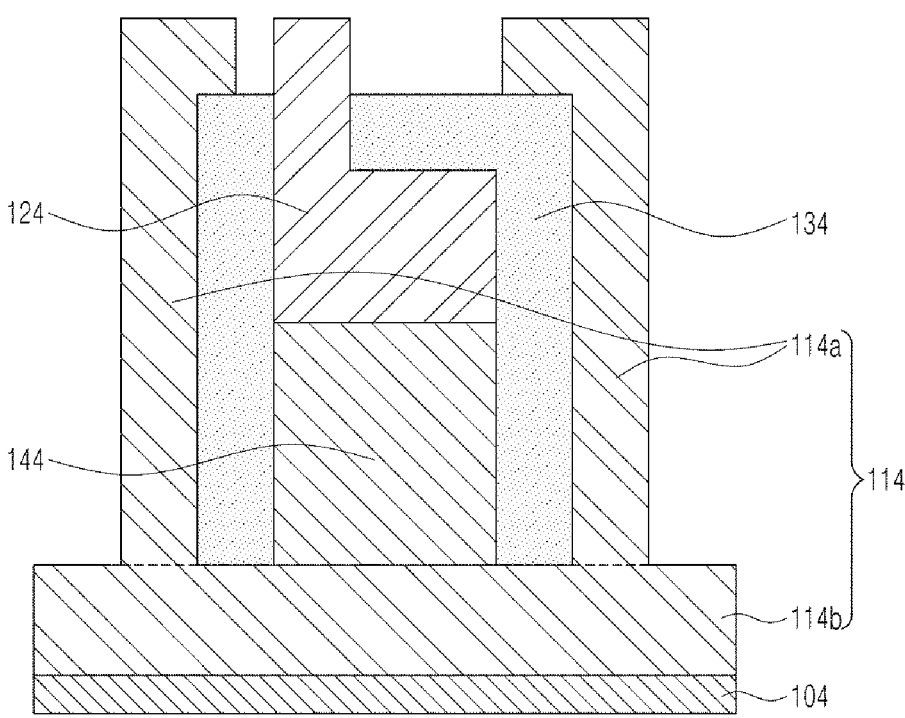
FIG. 3 is a sectional view of a non-volatile memory device according to an embodiment of the present invention.

FIG. 3 is a sectional view of a non-volatile memory device according to an embodiment of the present invention.

Referring to FIG. 3, a non-volatile memory device 14 according to an embodiment of the present invention may include a substrate 104, a first electrode 114, an insulating layer 134, a semiconductor layer 144, and a second electrode 124. The non-volatile memory device 14 according to the embodiment of the present invention is a 2-terminal structure, and may be a vertical structure in which at least a part of the first electrode 114, the insulating layer 134, the semiconductor layer 144, and the second electrode 124 are vertically disposed on the substrate 104. The non-volatile memory device 14 according to the embodiment of the present invention may be driven using an asymmetrical local energy state (ALES) induced in the semiconductor layer 144.

The first electrode 114 disposed on the substrate 104 may include a fourth electrode portion 114a and a fifth electrode portion 114b.

The fourth electrode portion 114a is a region including a portion vertically disposed in perpendicular to the substrate 104. In this case, the fourth electrode portion 114a may be disposed at opposite sides of the semiconductor layer 144 such that the semiconductor layer 144 is interposed between fourth electrode portions 114a. The insulating layer 134 is disposed between each fourth electrode portion 114a and the semiconductor layer 144. The fifth electrode portion 114b is a region horizontally disposed in parallel to the substrate 104 while contacting the semiconductor layer 144. That is, the fifth electrode portion 114b of the first electrode 114 may be disposed on the substrate 104, and the semiconductor layer 144, the insulating layer 134, and the fourth electrode portions 114a may be vertically disposed on the fifth electrode portion 114b.

The second electrode 124 may be disposed to contact the semiconductor layer 144. That is, the second electrode 124 may be disposed on the semiconductor layer 144. Generation of an ALES may be induced in the semiconductor layer 144 in accordance with application of a pulse signal to the second electrode 124 as described above. In addition, the ALES generated in the semiconductor layer 144 may be removed through application of a positive voltage in the form of a DC voltage to the first electrode 114.

Hereinafter, with reference to FIGS. 4 to 6, non-volatile memory devices according to embodiments of the present invention will each be described mainly in conjunction with a part thereof modified from a 3-terminal structure to a 2-terminal structure.

Figure 4:
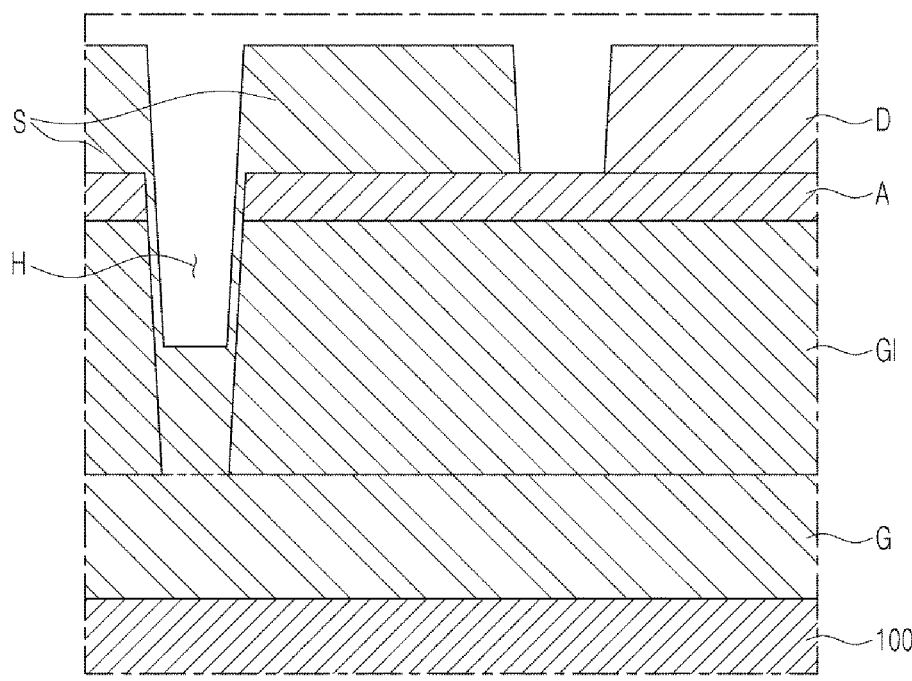
FIG. 4 is a sectional view of a non-volatile memory device according to an embodiment of the present invention.

Referring to FIG. 4, a non-volatile memory device 20 according to an embodiment of the present invention may include a substrate 100, a gate electrode G, a gate insulating layer GI, a semiconductor layer A, a source electrode S, and a drain electrode D. The non-volatile memory device 20 of FIG. 4 may be a horizontal structure in which the gate electrode G, the gate insulating layer GI, the semiconductor layer A, the source electrode S, and the drain electrode D are horizontally disposed on the substrate 100.

The source electrode S and the drain electrode D may be disposed to contact different portions of the semiconductor layer A, respectively. In this case, one of the source electrode S and the drain electrode D may be connected to the gate electrode G and, as such, may contact the gate electrode G. Although the source electrode S is shown in FIG. 4 as being connected to the gate electrode G, for convenience of description, embodiments of the present invention are not limited thereto. The drain electrode D may be connected to the gate electrode G, and the source electrode S may have an independent structure.

The gate electrode G may be horizontally disposed in parallel to the substrate 100. The source electrode S and the gate electrode G may be interconnected through a via hole H extending through the gate insulating layer GI and the semiconductor layer A.

Generation of an ALES may be induced in the semiconductor layer A in accordance with application of a pulse signal to the independently-disposed drain electrode D and application of a ground voltage or a voltage lower than that of the pulse signal to the source electrode S connected to the gate electrode G. In this case, the ALES may be asymmetrically and locally generated under the drain electrode D. In addition, the ALES generated in the semiconductor layer A may be removed through application of a positive voltage to the source electrode S connected to the gate electrode G and connection of a negative voltage to the drain electrode D or connection of the drain electrode D to ground.

Figure 5:
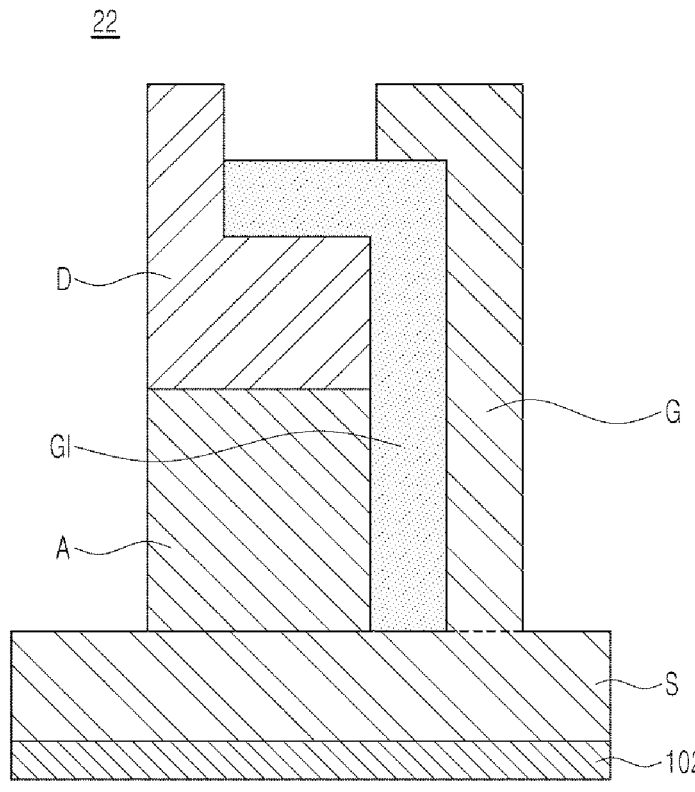
FIG. 5 is a sectional view of a non-volatile memory device according to an embodiment of the present invention.

Referring to FIG. 5, a non-volatile memory device 22 according to an embodiment of the present invention may include a substrate 102, a gate electrode G, a gate insulating layer GI, a semiconductor layer A, a source electrode S, and a drain electrode D. The non-volatile memory device 22 of FIG. 5 may be a vertical structure in which the gate electrode G, the gate insulating layer GI, and the semiconductor layer A are vertically disposed on the substrate 102.

The source electrode S and the drain electrode D may be disposed to contact different portions of the semiconductor layer A, respectively. In this case, one of the source electrode S and the drain electrode D may be connected to the gate electrode G and, as such, may contact the gate electrode G. Although the source electrode S is shown in FIG. 5 as being connected to the gate electrode G, for convenience of description, embodiments of the present invention are not limited thereto. The drain electrode D may be connected to the gate electrode G, and the source electrode S may have an independent structure.

The source electrode S may be horizontally disposed on the substrate 102, and the gate electrode G may be vertically disposed while contacting the source electrode S.

In this case, the gate insulating layer GI may be vertically disposed between the gate electrode G and the semiconductor layer A.

The drain electrode D may be disposed on the semiconductor layer A while being isolated from the source electrode S and the gate electrode G.

Generation of an ALES may be induced in the semiconductor layer A in accordance with application of a pulse signal to the independently-disposed drain electrode D and application of a ground voltage or a voltage lower than that of the pulse signal to the source electrode S connected to the gate electrode G. In this case, the ALES may be asymmetrically and locally generated under the drain electrode D. In addition, the ALES generated in the semiconductor layer A may be removed through application of a positive voltage to the source electrode S connected to the gate electrode G and connection of a negative voltage to the drain electrode D or connection of the drain electrode D to ground.

Figure 6:
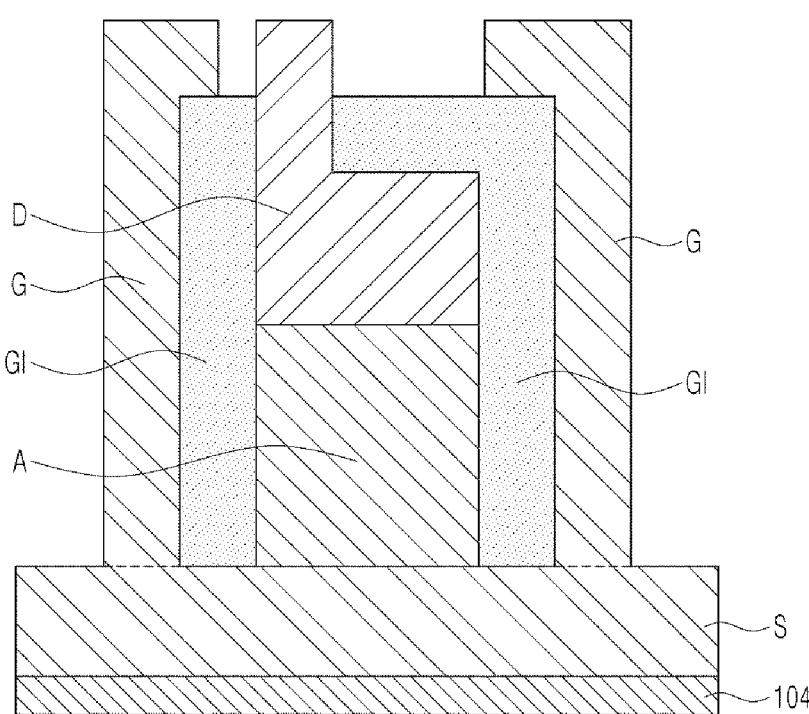
FIG. 6 is a sectional view of a non-volatile memory device according to an embodiment of the present invention.

Referring to FIG. 6, a non-volatile memory device 24 according to an embodiment of the present invention may include a substrate 104, a gate electrode G, a gate insulating layer GI, a semiconductor layer A, a source electrode S, and a drain electrode D. The non-volatile memory device 24 of FIG. 6 may be a vertical structure in which the gate electrode G, the gate insulating layer GI, and the semiconductor layer A are vertically disposed on the substrate 104.

The source electrode S and the drain electrode D may be disposed to contact different portions of the semiconductor layer A, respectively. In this case, one of the source electrode S and the drain electrode D may be connected to the gate electrode G and, as such, may contact the gate electrode G. Although the source electrode S is shown in FIG. 6 as being connected to the gate electrode G, for convenience of description, embodiments of the present invention are not limited thereto. The drain electrode D may be connected to the gate electrode G, and the source electrode S may have an independent structure.

The source electrode S may be horizontally disposed on the substrate 104, and the gate electrode G may be vertically disposed while contacting the source electrode S. In addition, the gate electrode G may be disposed at opposite sides of the semiconductor layer A such that the semiconductor layer A is interposed between gate electrodes G.

In this case, the gate insulating layer GI may be vertically disposed between each gate electrode G and the semiconductor layer A.

The drain electrode D may be disposed on the semiconductor layer A while being isolated from the source electrode S and the gate electrode G.

Generation of an ALES may be induced in the semiconductor layer A in accordance with application of a pulse signal to the independently-disposed drain electrode D and application of a ground voltage or a voltage lower than that of the pulse signal to the source electrode S connected to the gate electrode G. In this case, the ALES may be asymmetrically and locally generated under the drain electrode D. In addition, the ALES generated in the semiconductor layer A may be removed through application of a positive voltage to the source electrode S connected to the gate electrode G and connection of a negative voltage to the drain electrode D or connection of the drain electrode D to ground.

Hereinafter, a method of manufacturing a non-volatile memory device in accordance with various embodiments of the present invention will be described with reference to FIG. 7.

Figure 7A:
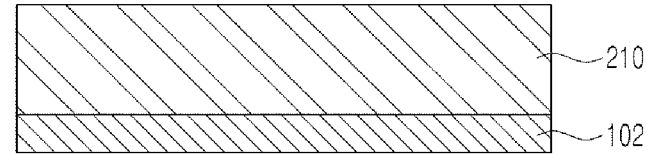
FIGS. 7A to 7G are process flow views explaining a method of manufacturing a non-volatile memory device according to various embodiments of the present invention.

Referring to FIG. 7A, a first electrode material 210 may be formed on a substrate 102.

Figure 7B:
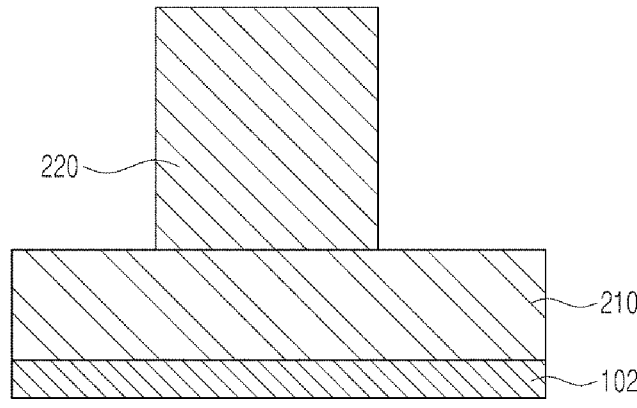

Referring to FIG. 7B, a semiconductor material 220 may be formed on the first electrode material 210.

Figure 7C:
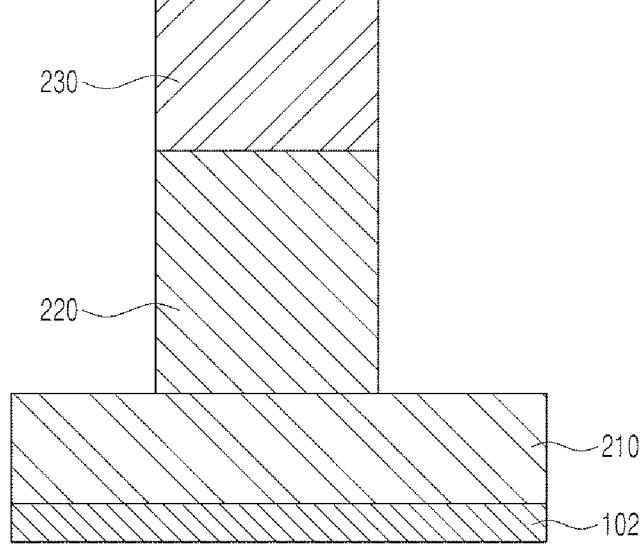

Referring to FIG. 7C, a second electrode material 230 may be formed on the semiconductor material 220.

Figure 7D:
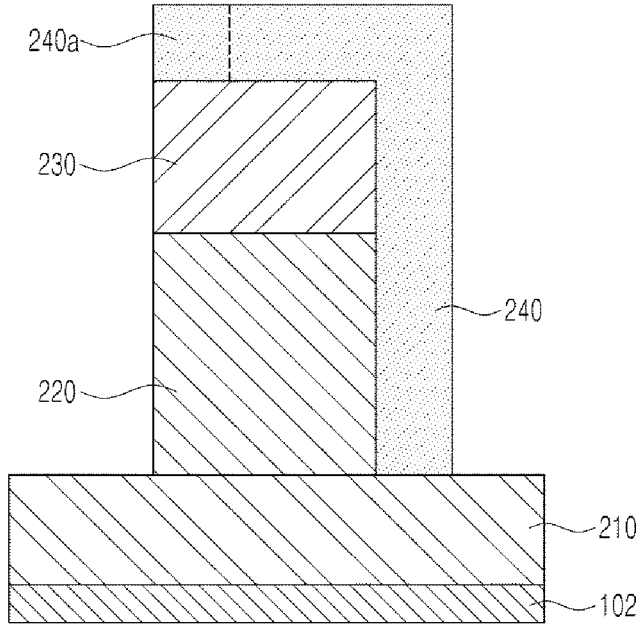

Referring to FIG. 7D, an insulating material 240 may be formed to cover one side surface of the semiconductor material 220 and one side surface and an upper surface of the second electrode material 230.

Figure 7E:
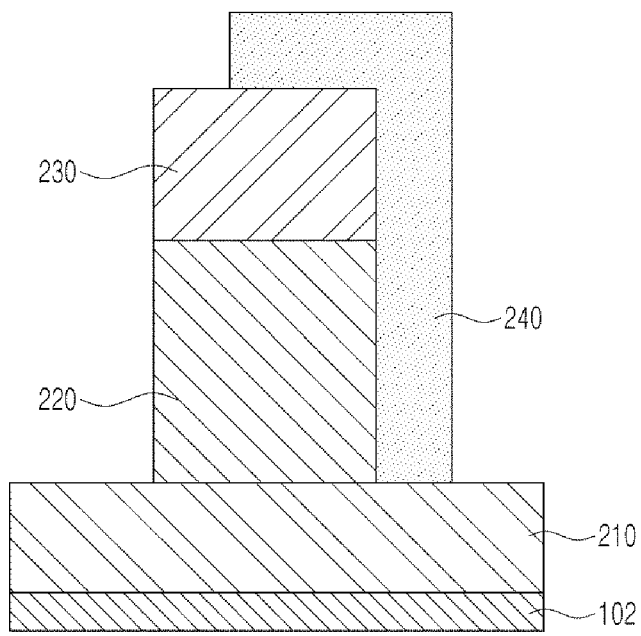

Referring to FIG. 7E, a portion of the insulating material 240 may be removed. That is, a portion 240a of the insulating material 240 on the second electrode material 230 may be removed, as shown in FIG. 7D.

Figure 7F:
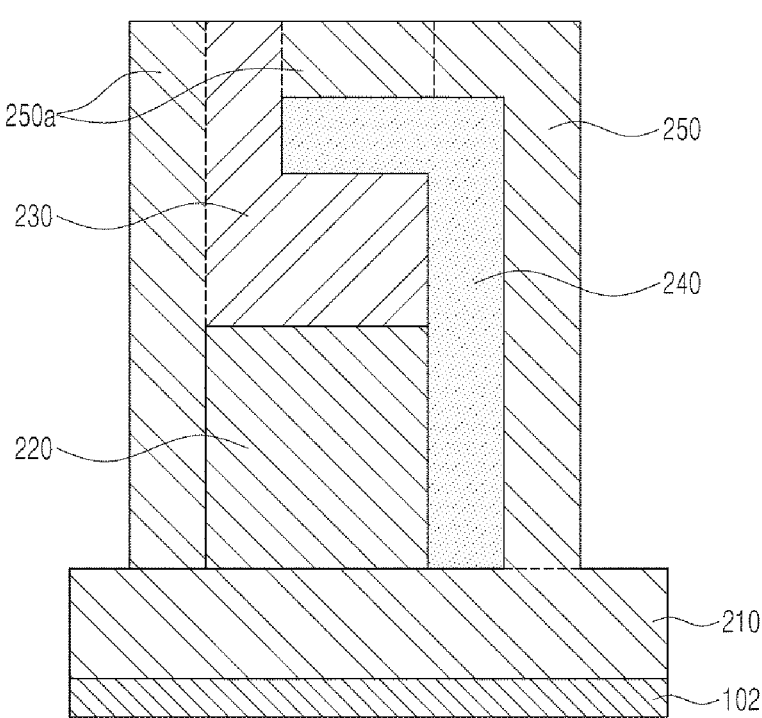

Referring to FIG. 7F, a third electrode material 250 may be formed to cover all of the semiconductor material 220, the second electrode material 230, and the insulating material 240.

Figure 7G:
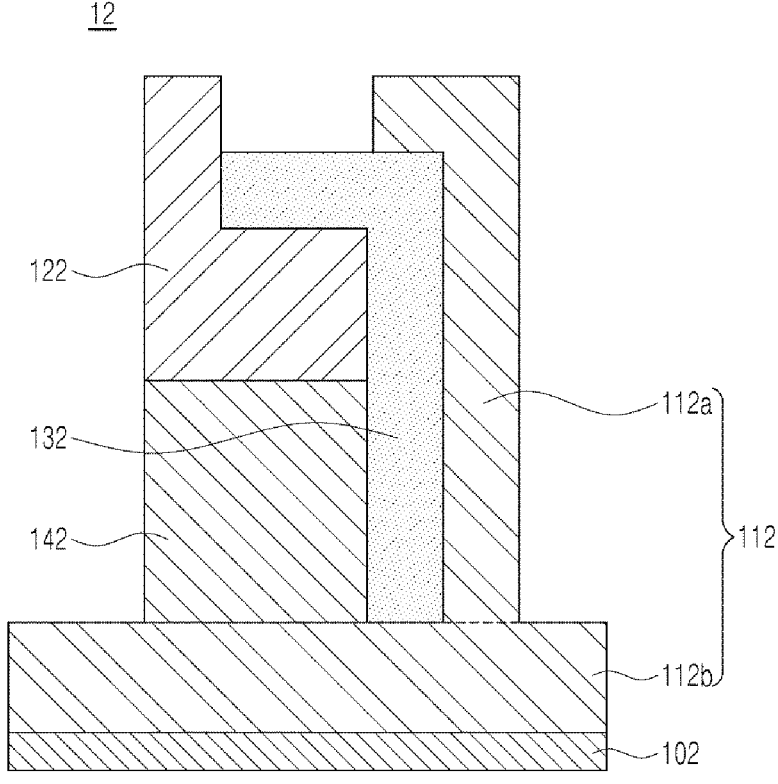

Referring to FIG. 7G, a portion of the third electrode material 250 may be removed. As shown in FIG. 7F, an independent second electrode 122 may be formed through removal of a portion 250a of the third electrode material 250. As a result, a non-volatile memory device having a vertical two-terminal structure constituted by a first electrode 112 and the second electrode 122 may be manufactured.

Hereinafter, a method of manufacturing a non-volatile memory device in accordance with various embodiments of the present invention will be described with reference to FIG. 8.

Figure 8A:
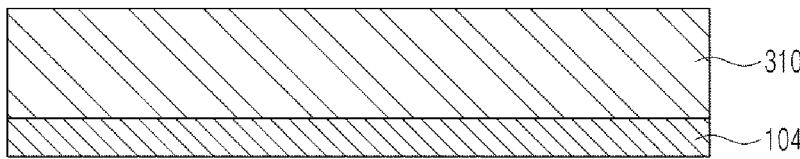
FIGS. 8A to 8G are process flow views explaining a method of manufacturing a non-volatile memory device according to various embodiments of the present invention.

Referring to FIG. 8A, a first electrode material 310 may be formed on a substrate 104.

Figure 8B:
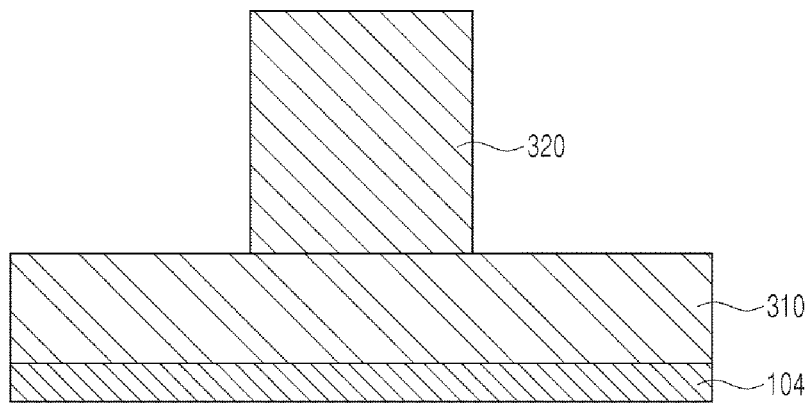

Referring to FIG. 8B, a semiconductor material 320 may be formed on the first electrode material 310.

Figure 8C:
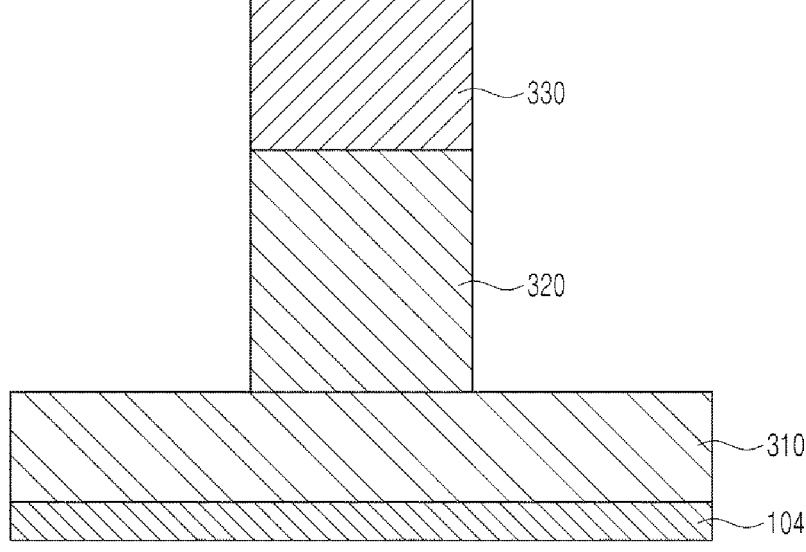

Referring to FIG. 8C, a second electrode material 330 may be formed on the semiconductor material 320.

Figure 8D:
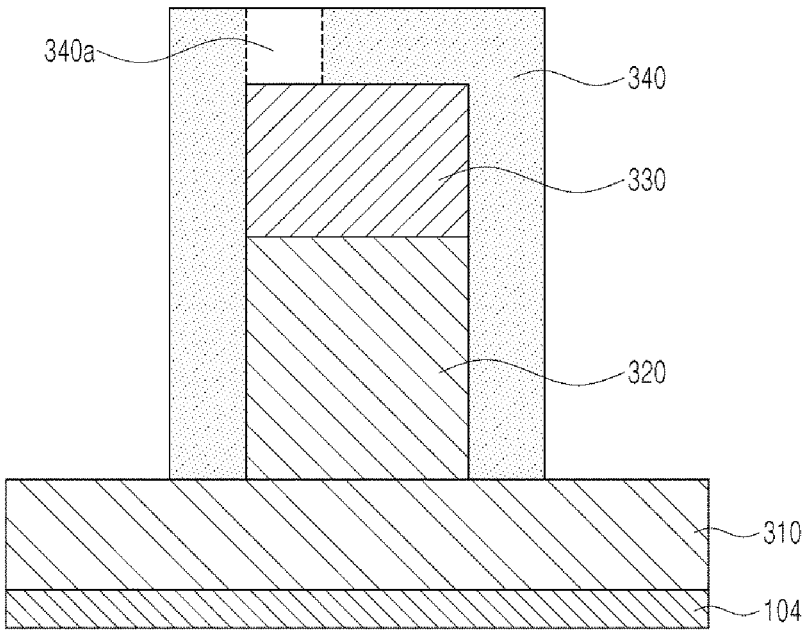

Referring to FIG. 8D, an insulating material 340 may be formed to cover both the semiconductor material 320 and the second electrode material 330.

Figure 8E:
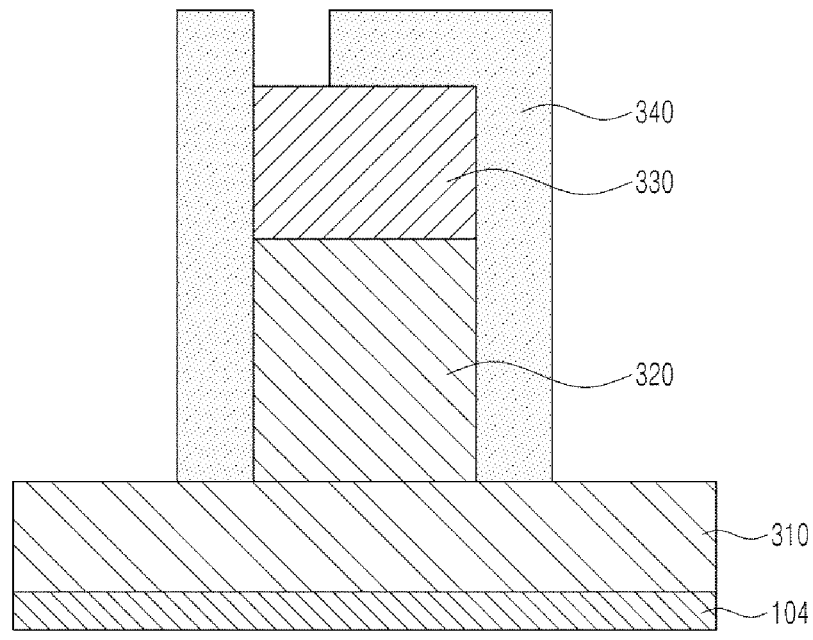

Referring to FIG. 8E, a portion of the insulating material 340 may be removed. That is, a portion 340a of the insulating material 340 on the second electrode material 330 may be removed, as shown in FIG. 8D.

Figure 8F:
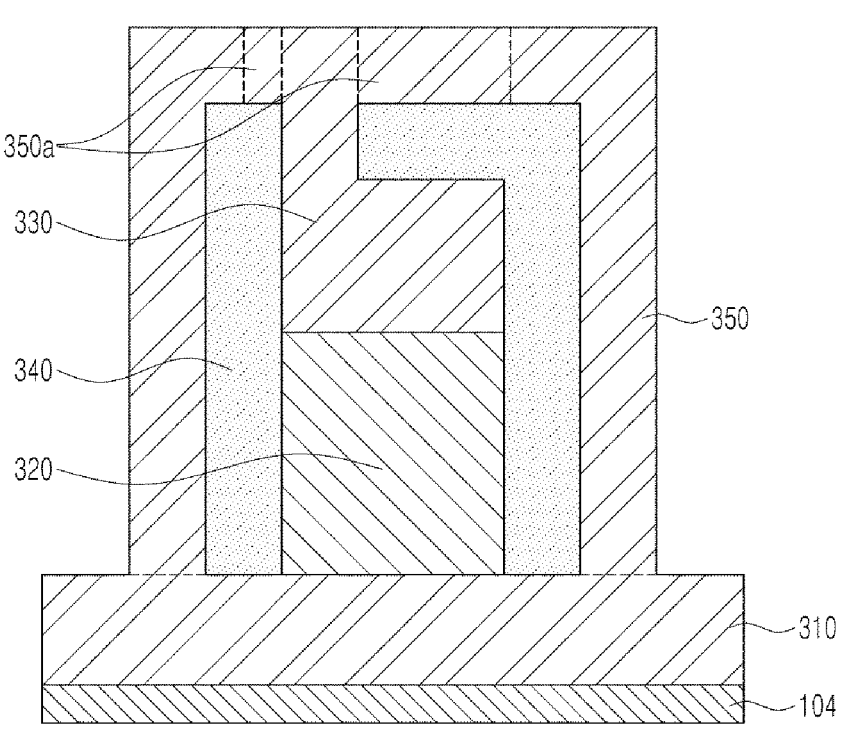

Referring to FIG. 8F, a third electrode material 350 may be formed to cover all of the semiconductor material 320, the second electrode material 330, and the insulating material 340.

Figure 8G:
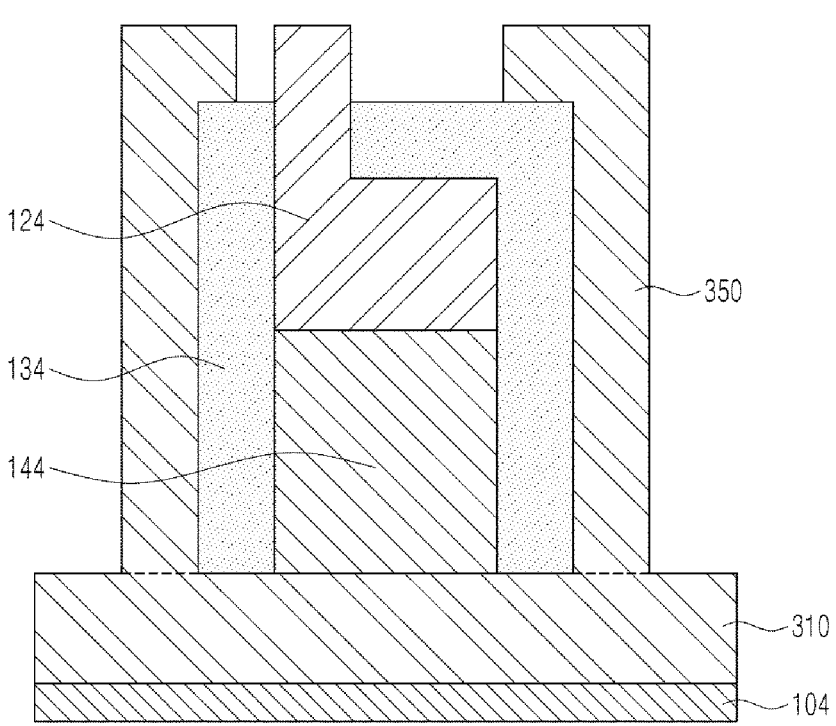

Referring to FIG. 8G, a portion of the third electrode material 350 may be removed. As shown in FIG. 8F, an independent second electrode 124 may be formed through removal of a portion 350a of the third electrode material 350. As a result, a non-volatile memory device having a vertical two-terminal structure constituted by a first electrode 114 and the second electrode 124 may be manufactured.

Figure 9:
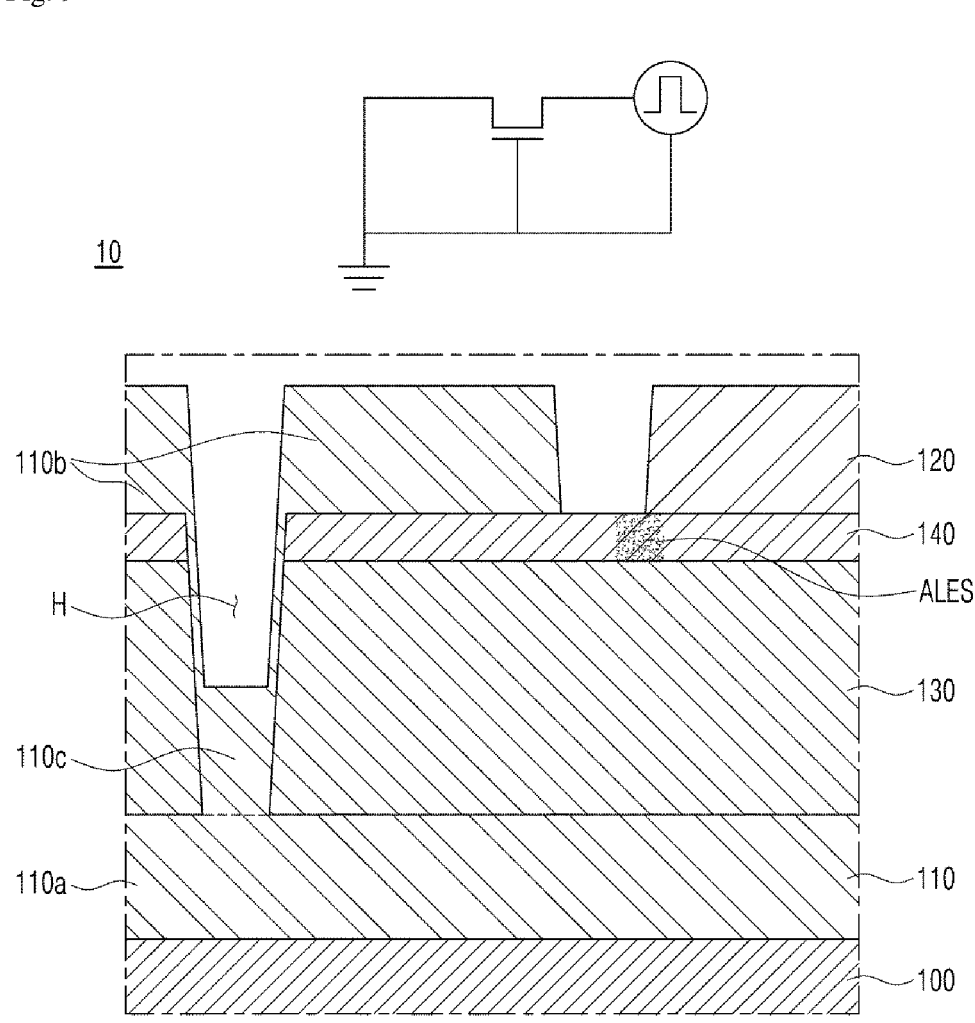
FIG. 9 is a view explaining induction of an ALES in a semiconductor layer.

Hereinafter, a method of driving a non-volatile memory device in accordance with various embodiments of the present invention will be described with reference to FIGS. 9 and 10.

The method of driving a non-volatile memory device in accordance with various embodiments of the present invention may include inducing an asymmetrical local energy state (ALES) in a semiconductor layer, and removing the ALES from the semiconductor layer, for recovery of the semiconductor layer.

In detail, induction of an ALES in the semiconductor layer will be described with reference to FIG. 9. In induction of an ALES in a semiconductor layer 140, a set behavior may be implemented through a variation in resistance. That is, generation of an ALES may be induced in the semiconductor layer 140 in accordance with application of a voltage in the form of a pulse to a second electrode 120 and connection of a first electrode 110 to ground or application of, to the first electrode 110, a voltage lower than the pulse applied to the second electrode 120. The ALES is a local energy state generated due to collision between accelerated electrons injected into the semiconductor layer 140 and semiconductor elements in the semiconductor layer 140.

In detail, as the first electrode 110 is maintained at a ground voltage or the voltage lower than the pulse, an ALES may be generated under the condition that application of current caused by the pulse to the semiconductor layer 140 is prevented. That is, the ALES may be generated by hot electrons generated as electrons injected from the second electrode 120 into the semiconductor layer 140 are instantaneously accelerated. Hot electrons are accelerated electrons having high energy. When such accelerated electrons are injected into the semiconductor layer 140, a local energy state may be generated due to collision of the accelerated electrons against semiconductor elements. Such a local energy state may be asymmetrically generated only in local regions under the second electrode 120 into which the pulse is injected. That is, the ALES may be generated at an edge portion of the second electrode 120 under the second electrode 120. The ALES generated as described above may cause distortion of an electric field, thereby interrupting flow of electrons. As a result, a high resistance state causing an increase in resistance may be induced.

Figure 10:
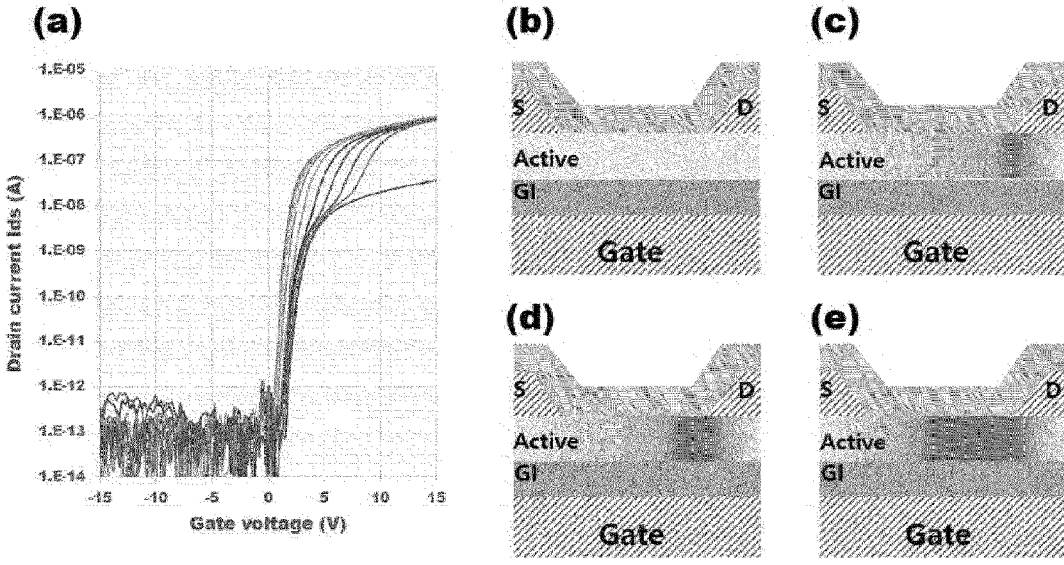
FIG. 10 is a graph illustratively depicting resistance or current capability of various levels according to a resistance state varied through a set behavior.

Meanwhile, FIG. 10 is a graph illustratively depicting resistance or current capability of various levels according to a resistance state varied through a set behavior. That is, referring to FIG. 10(a), it may be seen that various amounts of current may be generated at a particular voltage of, for example, 3V, in accordance with the form of an applied pulse. In addition, referring to FIGS. 10(b) to 10(e), it may be seen that an ALES may be grown to have various sizes in accordance with the form of the pulse. Accordingly, the non-volatile memory device of the present invention may realize multi-level characteristics by diversely varying a resistance level.

Figure 11:
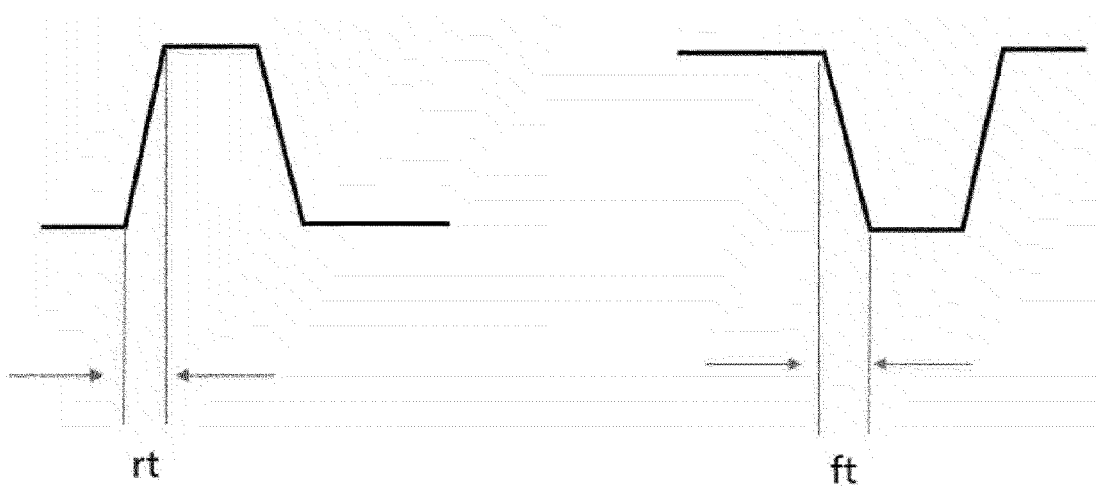
FIG. 11 is a diagram explaining a rising time rt and a falling time ft of a pulse.

Referring to FIG. 11, generation and/or growth of an ALES may be controlled through adjustment of at least one of a rising time rt or a falling time ft of a pulse.

The rising time rt and the falling time ft of the pulse injected into the second electrode 120 in a set behavior are very important. That is, it may be possible to control the size or generation speed of an ALES generated in the semiconductor layer 140 in accordance with the number of pulses. For example, when the number of pulses increases, the size of the ALES may be enlarged. On the other hand, when the rising time rt or the falling time ft is reduced, generation of the ALES may be accelerated. Accordingly, when it is desired to obtain a great variation in resistance, the rising time rt or the falling time ft may be abruptly adjusted, whereas, when it is desired to obtain a fine variation in resistance, the rising time rt or the falling time ft may be gently adjusted.

Preferably, the rising time rt or the falling time ft may be $10^{-7}$ sec or less in accordance with the present invention. Meanwhile, no or very weak ALES may be generated when the rising time rt or the falling time ft is more than $10^{-7}$ sec.

Meanwhile, the magnitude of the pulse may be varied in accordance with the thickness of the semiconductor layer, the distance between the electrodes, etc.

Figure 12:
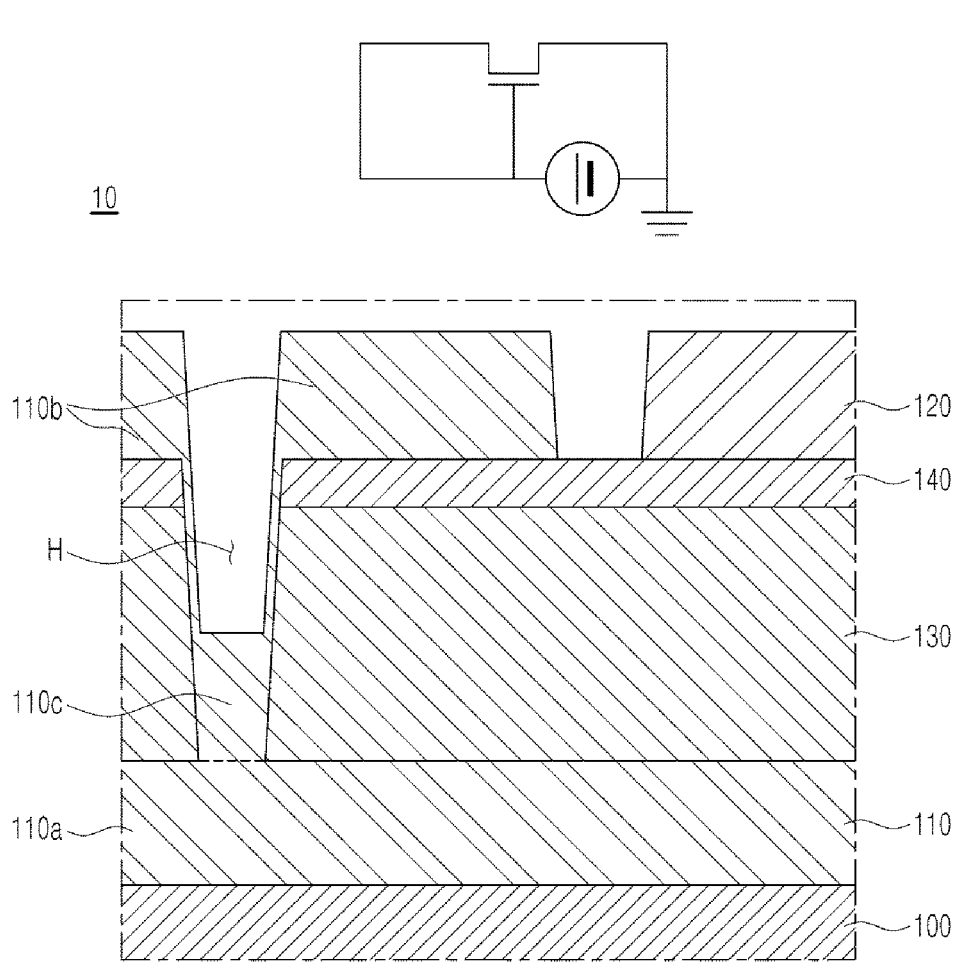
FIG. 12 is a view explaining removal of an ALES from a semiconductor layer, for recovery of the semiconductor.

Next, the removing the ALES from the semiconductor layer, for recovery of the semiconductor layer, will be described with reference to FIG. 12. A reset behavior may be implemented by removing the ALES from the semiconductor layer, for recovery of the semiconductor layer. The reset behavior is a procedure for recovering the ALES, which is a varied or programmed state (a state in which a resistance has been varied to a desired level), to a resistance level in an initial state.

In detail, the ALES generated in the semiconductor layer 140 may be removed through application of a positive voltage in the form of a DC voltage to the first electrode 120 and connection of a negative voltage to the second electrode 120 or connection of the second electrode 120 to ground. On the other hand, a voltage may be applied to the first electrode 110 in the form of an AC voltage or a pulse other than a DC voltage. As current flows through the semiconductor layer 140 in accordance with the above-described procedure, Joule heating is induced and, as such, the ALES may be removed. Accordingly, the semiconductor layer 140 may be recovered to an original state thereof. Thus, a low resistance state causing a decrease in resistance may be induced.

Figure 13:
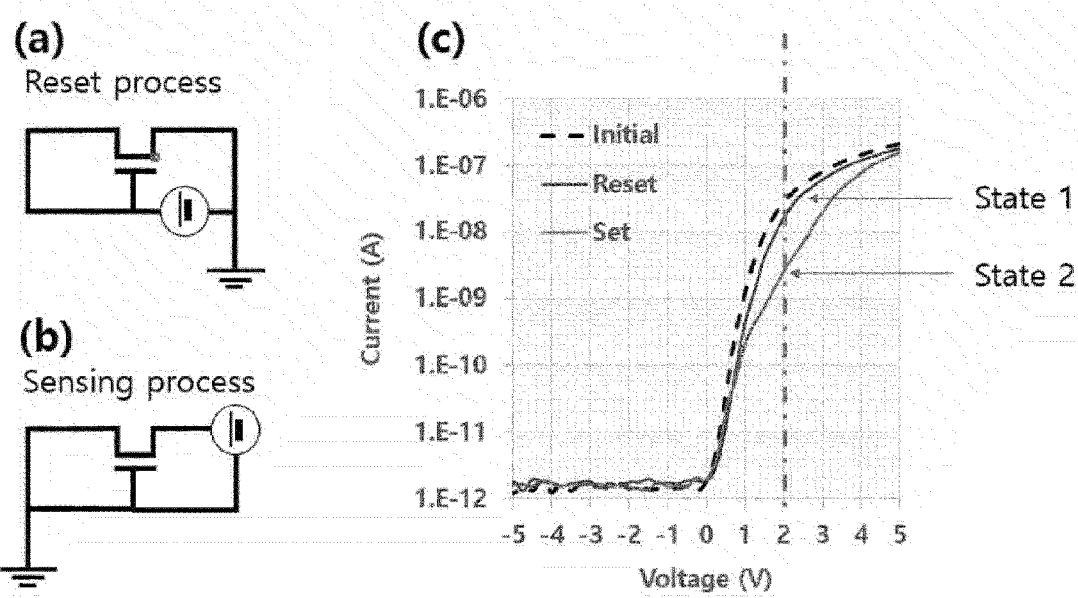
FIG. 13(a) is a circuit diagram showing execution of a reset process.
FIG. 13(b) is a circuit diagram showing execution of a sensing process.
FIG. 13(c) is a graph depicting electrical characteristic curves exhibited after execution of the reset process.

Meanwhile, referring to FIG. 13(c), when states are in accordance with a particular voltage (for example, 2V), two different states may be defined. In addition, as described above, different resistances may be generated by generating ALESs having different sizes and, as such, multi-level characteristics of multiple resistors may be realized. Through such a state variation, it may be possible to perform a data writing procedure or a data reading procedure.

Referring to FIGS. 13(a) and 13(b), sensing may be performed after the reset behavior. In this case, the sensing is an evaluation method capable of identifying a resistance level.

In more detail, the non-volatile memory device driving method according to the present invention may further include sensing performed after at least one of the inducing an ALES and the removing the ALES for recovery of the semiconductor layer. That is, the sensing is an evaluation method for identifying a resistance level after execution of

Figure 14:
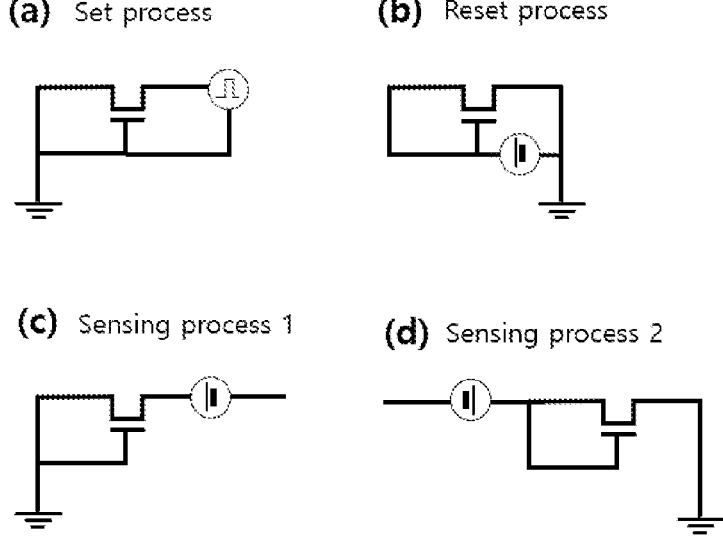
FIG. 14 is a circuit diagram explaining set, reset and sensing processes.

11 each state variation (set or reset). The sensing may be performed as shown in FIGS. 13(b), 14(c), and 14(d). For example, FIG. 14(a) shows a procedure for inducing an ALES, as described above. In this procedure, a voltage in the form of a pulse may be applied to the second electrode, and a ground voltage may be connected to the first electrode. Referring to FIG. 14(c), for execution of sensing after such a set behavior, a low voltage is applied to the second electrode under the condition that connection of the first electrode to ground is maintained and, as such, a resistance level may be identified. In addition, FIG. 14(b) shows a procedure for removing the ALES, for recovery of the semiconductor layer, as described above. In this procedure, the second electrode may be connected to ground, and a positive voltage may be applied to the first electrode. For execution of sensing after such a reset behavior, a low voltage may be applied to the first electrode under the condition that connection of the second electrode to ground is maintained.

In the sensing as described above, evaluation may be performed at a low voltage capable of preventing generation of Joule heating. For example, evaluation may be performed at a voltage limited to 2V or less.

Hereinafter, the present invention will be described in detail with reference to an example. Of course, the following example is only for illustration of the present invention and, as such, the present invention is not limited to the following example.

Example

A non-volatile semiconductor resistive memory was implemented using a device having the structure of FIG. 1. In the device used for an experiment, the first electrode and the second electrode were formed of molybdenum (Mo), and the insulating layer was formed of two layers of silicon nitride ($SiN_x$) and silicon oxide ($SiO_x$). In this case, the silicon nitride ($SiN_x$) layer has a thickness of 150 nm, and the silicon oxide ($SiO_x$) layer has a thickness of 50 nm. The semiconductor layer includes InGaZnO, and was formed to have a thickness of 40 nm. The width between the first electrode and the second electrode disposed on the semiconductor layer is 4 μm.

In a procedure for inducing an ALES, a pulse applied to the second electrode was 20V, the rising time rt and the falling time ft were $10^{-7}$ sec, and the duty cycle was 20%. Meanwhile, the first electrode was connected to ground.

Next, in a procedure for removing the ALES, for recovery of the semiconductor layer, a DC voltage of 20V was applied to the first electrode, and the second electrode was connected to ground.

As a result, it was identified that the device is applicable to a non-volatile memory in accordance with generation and removal of the ALES, as described above with reference to FIG. 10.

Features, structures, effects, and so on described in the above embodiments are included in at least one of the embodiments, but not limited to only one embodiment invariably. Furthermore, it is apparent that the features, the structures, the effects, and so on described in the embodiments can be combined or modified with other embodiments by those skilled in the field to which the embodiments pertain. Therefore, it should be understood that the contents relevant to such combination and modification fall within the scope of the present invention.

In addition, although the present invention has been described mainly in conjunction with embodiments, the embodiments are only illustrative without limiting the present invention. It will be appreciated by those skilled in the field to which the present invention pertains that various modifications and applications not illustrated in the above description may be implemented within the scope of essential characteristics of the present embodiments. For example, each constituent element concretely represented in the embodiments may be implemented in a modified state. In addition, differences associated with such modifications and applications should be interpreted as falling within the scope of the present invention defined in the appended claims.

INDUSTRIAL APPLICABILITY

The present invention provides a non-volatile memory device having a 2-terminal structure capable of being driven through a new mechanism different from those of existing resistive memories and realizing multi-level characteristics of multiple resistors. In particular, the present invention may implement a non-volatile memory using an asymmetrical local energy state (ALES) generated in accordance with instantaneous acceleration of electrons injected into a semiconductor layer and, as such, has high industrial applicability.

The invention claimed is:

1. A non-volatile memory device comprising:
   a substrate;
   a first electrode disposed on the substrate;
   an insulating layer contacting the first electrode;
   a semiconductor layer contacting the insulating layer; and
   a second electrode contacting the semiconductor layer,
   wherein the non-volatile memory device is driven using an asymmetrical local energy state (ALES) induced in the semiconductor layer under a condition that at least a portion of the first electrode contacts the semiconductor layer.

2. The non-volatile memory device according to claim 1, wherein the ALES is a local energy state generated due to collision between accelerated electrons injected into the semiconductor layer and semiconductor elements in the semiconductor layer.

3. The non-volatile memory device according to claim 1, wherein the first electrode comprises:
   a first electrode portion horizontally disposed in parallel to the substrate;
   a second electrode portion horizontally disposed in parallel to the substrate while contacting the semiconductor layer; and
   a third electrode portion configured to interconnect the first electrode portion and the second electrode portion.

4. The non-volatile memory device according to claim 3, wherein:
   the insulating layer and the semiconductor layer are horizontally disposed in parallel to the substrate;
   the insulating layer and the semiconductor layer comprise a via hole extending therethrough; and
   at least a part of the third electrode portion is disposed within the via hole.

5. The non-volatile memory device according to claim 1, wherein the first electrode comprises:
   a fourth electrode portion vertically disposed in perpendicular to the substrate; and
   a fifth electrode portion horizontally disposed in parallel to the substrate while contacting the semiconductor layer.

13

14

6. A non-volatile memory device comprising:

a substrate;

a gate electrode disposed on the substrate;

a gate insulating layer contacting the gate electrode;

a semiconductor layer contacting the gate insulating layer; and a source electrode and a drain electrode disposed to contact different portions of the semiconductor layer, respectively, wherein one of the source electrode and the drain electrode contacts the gate electrode, and is driven using an asymmetrical local energy state (ALES) induced in the semiconductor layer.

7. The non-volatile memory device according to claim 6, wherein the ALES is a local energy state generated due to collision between accelerated electrons injected into the semiconductor layer and semiconductor elements in the semiconductor layer.

8. The non-volatile memory device according to claim 6, wherein:

the gate electrode is horizontally disposed in parallel to the substrate;

the gate electrode comprises a via hole extending through the gate insulating layer and the semiconductor layer; and the gate electrode contacts at least one of the source electrode or the drain electrode through the via hole.

9. The non-volatile memory device according to claim 6, wherein:

the gate electrode is vertically disposed in perpendicular to the substrate; and at least one of the source electrode or the drain electrode is horizontally disposed in parallel to the substrate while contacting the gate electrode.

10. A method of driving a non-volatile memory device comprising a first electrode, a second electrode, and a semiconductor layer, the method comprising:

inducing an asymmetrical local energy state (ALES) generated due to instantaneous acceleration of electrons injected into the semiconductor layer;

removing the ALES from the semiconductor layer, for recovery of the semiconductor layer, wherein generation of the ALES is controlled through adjustment of at least one of a rising time or a falling time of the pulse.

11. The method according to claim 10, wherein the inducing an ALES comprises:

applying a voltage in the form of a pulse to the second electrode;

applying a ground voltage or a voltage lower than the pulse to the first electrode.

12. The method according to claim 10, wherein the at least one of the rising time or the falling time of the pulse is $10^{-7}$ sec or less.

13. The method according to claim 11, wherein, in the inducing an ALES, the ALES is asymmetrically and locally generated under the second electrode.

14. The method according to claim 11, wherein the removing the ALES, for recovery of the semiconductor layer, comprises:

applying a positive voltage to the first electrode; and connecting a negative voltage to the second electrode or connecting the second electrode to ground.

15. The method according to claim 10, further comprising:

sensing performed after at least one of the inducing an ALES or the removing the ALES for recovery of the semiconductor layer, wherein the sensing evaluates a resistance level in each of the inducing an ALES and the removing the ALES for recovery of the semiconductor layer.

*     *     *     *     *